US006750742B2

(12) United States Patent
Kang et al.

(10) Patent No.: US 6,750,742 B2
(45) Date of Patent: Jun. 15, 2004

(54) RADIO FREQUENCY DEVICE USING MICRO-ELECTRONIC-MECHANICAL SYSTEM TECHNOLOGY

(75) Inventors: Sung Weon Kang, Daejon (KR); Sung Hae Jung, Daejon (KR); Woo Seok Yang, Daejon (KR); Yun Tae Kim, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 2 days.

(21) Appl. No.: 10/331,592

(22) Filed: Dec. 30, 2002

(65) Prior Publication Data

US 2004/0085166 A1 May 6, 2004

(30) Foreign Application Priority Data

Nov. 1, 2002 (KR) ................................ 10-2002-0067556

(51) Int. Cl.[7] .............................. H01P 1/10; B81B 3/00
(52) U.S. Cl. ........................................ 333/262; 200/181
(58) Field of Search ................................ 333/101, 105, 333/262; 200/181; 335/128, 187; B81B 3/00, 5/00, 7/00

(56) References Cited

U.S. PATENT DOCUMENTS

| | | | | |
|---|---|---|---|---|
| 4,570,139 A | * | 2/1986 | Kroll .......................... | 335/187 |
| 4,835,790 A | | 5/1989 | Yoshida et al. | |
| 5,578,976 A | | 11/1996 | Yao | |
| 5,619,061 A | | 4/1997 | Goldsmith et al. | |
| 6,028,894 A | | 2/2000 | Oishi et al. | |
| 6,034,952 A | | 3/2000 | Dohi et al. | |
| 6,188,301 B1 | * | 2/2001 | Kornrumpf et al. ........ | 333/262 |
| 6,218,911 B1 | * | 4/2001 | Kong et al. ................. | 333/101 |
| 6,373,878 B1 | | 4/2002 | Palenius et al. | |
| 6,404,826 B1 | | 6/2002 | Schmidl et al. | |
| 6,621,387 B1 | * | 9/2003 | Hopcroft .................... | 333/262 |

FOREIGN PATENT DOCUMENTS

| | | |
|---|---|---|
| DE | 1999-0043692 | 6/1999 |
| DE | 2000-190298 | 7/2000 |
| DE | 2001-80255 | 8/2001 |
| DE | 2001-101615 | 11/2001 |

OTHER PUBLICATIONS

IEEE Journal of Microelectromechanical Systems, vol., 8, No. 2, Jun. 1999, Micromachined Low–Loss Microwave Switches, Z. Yao, et al., 6 pages.

* cited by examiner

*Primary Examiner*—Benny Lee
*Assistant Examiner*—Dean Takaoka
(74) *Attorney, Agent, or Firm*—Blakely, Sokoloff, Taylor & Zafman

(57) ABSTRACT

Provided is a radio frequency device using a micro-electronic-mechanical system (MEMS) technology that can be applied to a mobile communication area by reducing the operating voltage, while increasing the operating speed. The RF device of the present research includes: a substrate; a first electrode which is mounted on the substrate and forms an actuator, part of the first electrode not contacting the substrate; and a second electrode which is apart in a regular space from the substrate and forms an actuator, part of the second electrode being overlapped with the first electrode, wherein the first electrode and the second electrode contact each other at a contact point by an electrostatic attractive force generated between the two electrodes.

12 Claims, 8 Drawing Sheets

RADIO FREQUENCY DEVICE USING MICRO-ELECTRONIC-MECHANICAL SYSTEM TECHNOLOGY

FIELD OF THE INVENTION

The present invention relates to a radio frequency device; and, more particularly, to a radio frequency device using a micro-electronic-mechanical system (MEMS) technology.

DESCRIPTION OF RELATED ART

Generally, a micro-electronic-mechanical system (MEMS) technology is called a micromachining, micro-system or ultra-small size precise machine technology. The technology is used to manufacture ultra-small three-dimensional structure by processing a wafer.

The methods for applying the MEMS technology to the radio frequency (RF) area are studied actively, especially in the areas of radio communication and national security. In particular, the low-loss RF switch and low-loss filter draw explosive attention from the radio communication area.

The low-loss RF switch uses an electrostatic attractive force. The switch has two types: one moving the beams of the switch right and left, and the other moving them up and down. The two types of low-loss RF switches are divided again into a direct contact switch (or it is called a resistive switch) and a capacitive switch.

The conventional resistive or capacitive MEMS switch is mounted on a substrate. A top electrode is formed in the form of a cantilever or a membrane, and it works as an actuator, which makes a movement by the electrostatic attractive force with a bottom electrode, which is a signal line. The conventional resistive or capacitive MEMS switch uses the principle of the top electrode and the bottom electrode connected to each other through the electrostatic attractive force to transmit an RF signal.

In case where the resistive MEMS switch is desired to be operated under an operating voltage of 3V in the current mobile communication area, the spring constant k should be as sufficiently small as 1 N/m~3 N/m. To make the spring constant that small, the physical length of the switch should be longer than 500 $\mu$m. After all, this increase in the physical length drops the reliability of the MEMS switch device, and increases the switching time as much as several milliseconds.

Meanwhile, if the physical length of the MEMS switch device is reduced, a problem of increasing operating voltage emerges. Therefore, researchers are studying to develop a switch with short physical length and small spring constant.

In case where a capacitive MEMS switch should be operated at a high speed of several microseconds ($\mu$s), more than 20V of high operating voltage is required. To speed up the switch, various efforts have been attempted, such as making an air hole in the actuator to thereby reduce the mass, or modifying the shape of the actuator to make the spring constant small and thus reduce the operating voltage and improve the switch rate of the switch.

As described above, low operating voltage and rapid switching time are required to apply the switch, which can be operated in the RF range, to the mobile communication terminal.

In case of the capacitive MEMS switch, operating voltage as high as 50V should be supplied to make the switch operate at a high speed of 4–6 $\mu$s. [Z. Jamie Yao, Shea Chen, Susan Eshelman, David Denniston and Chuck "Micromachined Low-Loss Microwave Switches," IEEE Journal of Micro-electro-mechanical Systems, Vol. 8, pp. 129, 1999]

Meanwhile, when the capacitive switch that operates at a high voltage is embodied to operate at a low temperature, the operation of the switch needs to be optimized according to the shape change of a bridge structure, and the air gap has to be smaller. However, when the air gap is reduced, the isolation of the RF signal is deteriorated. Therefore, the air gap should be maintained around 1–4 $\mu$m. [J. M. Huang, K. M. Liew, C. H. Wong, S. Rajendran, M. J. Tan and A. Q. Liu, "Mechanical Design and Optimization of Capacitive Micromachined Switch," Sensors and Actuators A 93 pp. 273, 2001]

Particularly, since the switching characteristic of the capacitive MEMS switch is more improved, as the capacitance ratio between on and off is large, a dielectric substance having a higher dielectric rate may be applied. [G. M. Rebeiz and J. B. Muldavin, "RF MEMS Switches and Switch Circuit," IEEE Microwave Magazine, Vol. 2, pp. 67, 2001; and Wallace W. Martin, Yu-Pei Chen, Byron Williams, Jose Melendez and Darius L. Crenshaw, "Micro-electronic-mechanical Switch with Fixed Metal Electrode Dielectric Interface with a Protective Cap Layer," U.S. Pat. No. 6,376,787, April, 2002.] However, the capacitive MEMS switch still operates at a high operating voltage over 20V.

When the resistive MEMS switch is embodied to be operated under 3V, which is the operating voltage in the current mobile communication area, the spring constant k should be as sufficiently small as 1~3 N/m. Accordingly, the physical length of the switch becomes as long as more than 500 $\mu$m, thus causing a problem in the device reliability and switching rate. [Robert Y. Loo, Adele Schmitz, Julia Brown, Jonathan Lynch, Debabani Cohoudhury, James Foshaar, Daniel J. Hyman, Juan Lam, Tsung-Yuan Hsu, Jae Lee, Mehran Mehregany "Design and Fabrication of Broadband Surface-Micromachined micro-electro-mechanical Switches for Microwave and Millimeter Wave Applications," U.S. Pat. No. 6,046,659, April, 2000; and L. R. Sloan, C. T. Sullivan, C. P. Tigges, C. E. Sandowal, D. W. Palmer, s. Hietala, T. R. Christenson, C. W. Dyck, T. A. Plut, and G. R. Schuster "RF Micro-mechanical Switches That Can Be Post Processes on Commercial MMIC," Electric Component and Technology Conference 2001.]

Meanwhile, when the physical length of the switch device is shortened, there is a problem that the operating voltage is raised. So, researchers are studying to find a MEMS switch of a new structure using an electrostatic attractive force, and a new material. When a new material is to be found, the area of the membrane should be large and the mass should be small to make the switch operate at a low voltage, and these conditions are contrary to each other.

Hereinfrom, the conventional resistive and capacitive MEMS switches are described with embodiments.

FIG. 1 is a plane figure showing a conventional membrane-type capacitive switch, and FIG. 2 is a cross-sectional view illustrating the capacitive switch of FIG. 1, cut along the line a–a'.

Referring to FIGS. 1 and 2, a conventional capacitive switch 18, which is fabricated in the micro-fabrication process technique, such as photolithography, etching, deposition and lifting-off, is provided to a substrate 10 having such a characteristic as insulation, semi-insulation or semiconduction, and polymerization.

The capacitive switch 18 largely has two parts: a part fixed on the substrate 10 (to be referred to as a fixed part, herefrom), and the other part that makes a mechanical movement, that is, actuating part (to be referred to as an actuator, herefrom).

The part fixed on the substrate 10 includes an insulation layer 11, a bottom electrode 12, a capacitive dielectric layer 13, and a grounding surface 17, and the actuator includes a top electrode 15.

To be more concretely, the insulation layer 11 is formed on the substrate 10, and a plurality of grounding surfaces 17, which are connected with an active zone (not shown) formed inside the substrate 10 or the conduction layer, are embodied and arranged through metal wires. Between the grounding surfaces 17, there is the bottom electrodes laid, and on the bottom electrode 12, the dielectric layer 13 covering the bottom electrode 12 is positioned. On top of the dielectric layer 13, there is the top electrode 15 supported by the supporting material 14 positioned at both ends of the insulation layer 11. Therefore, the top electrode 15 forms a membrane structure having a regular space (d) with the dielectric layer 13 under the top electrode 15 by the cavity formed in the lower part of the top electrode 15.

The top electrode 15 is an actuator. S, when an electric voltage is supplied to the top electrode 15, the top electrode 15 is drawn to the bottom electrode 12 by the electrostatic attractive force generated by its potential difference with the bottom electrode 12 and contacts the dielectric layer 13.

Here, since the top electrode 15 and the bottom electrode 12 are formed of a metal, such as Al and Cu, the top electrode 15, dielectric layer 13 and the bottom electrode 12 form a MIM capacitor having a metal electrode, in which a dielectric substance is between the metals. Accordingly, an external RF signal supplied through the bottom electrode 12 is shut by the capacitor, and the grounding surface 17 grounds the RF and direct current (DC).

Referring to FIG. 2, when the top electrode 15 and the bottom electrode 12 are separated by an air layer having a space (d), the RF signal is transmitted to the bottom electrode 12. Here, the larger the dielectric constant of the dielectric layer 13 is, the bigger the capacity is and the better the shutting characteristic becomes.

However, when the space (d) becomes narrower, the RF signal isolation of the switch 18 is degraded and the process of making the space (d) narrower has a technical limitation, too.

FIG. 3 is a plane figure showing a conventional membrane-type resistive switch, and FIG. 4 is a cross-sectional view illustrating the resistive switch of FIG. 3, cut along the line b–b'.

Referring to FIGS. 3 and 4, a resistive switch 28 includes a bottom electrode 21 and a supporting material 22 fixed on the substrate 20, and an contact pad 23, which is an actuator, an insulation membrane 24, and a top electrode 26.

To be more concrete, a plurality of bottom electrodes 21 are arrayed on the substrate 20, and on top of the bottom electrode 21, the membrane 24 is positioned by the supporting material 22 at both ends of the substrate.

Here, the membrane 24 is formed of such a material as nitride layer having a conventional compressibility and extensibility. The membrane 24 has a regular space with the bottom electrode 21 under the membrane 24 by the cavity 25 formed in the lower part of the membrane 24. The contact pad 23 is positioned on one surface of the membrane 24 that confronts the bottom electrode 21. So, the membrane 24 is drawn toward the bottom electrode 21 by the electrostatic attractive force between the top electrode 26 and the bottom electrode 21 and contacts the bottom electrode 21. The top electrode 26 is positioned on top of the membrane 24, that is, on a surface of the membrane 24 that does not confront the bottom electrode 21.

The bottom electrode 21 and the contact pad 23, to which the RF signal inputted via signal line 27 is inputted, are in the off state. When a DC is supplied to the top electrode 26, the membrane 24 moves towards the bottom electrode 21 by the electrostatic attractive force between the top electrode 26 and the bottom electrode 21, and thus the membrane 24 contacts the bottom electrode 21. This is the on state.

Here, if the DC supplied to the top electrode 26 is shut, the bottom electrode 21 and the contact pad 23 are separated and the state is converted back into the off state by the elastic restoring force of the membrane 24, of which both ends are fixed on the substrate 20 by the supporting material 22. In the off state as shown in FIG. 4, the contact pad 23 is separated from the bottom electrode 21. Therefore, the RF signal supplied to the bottom electrode 21 stops flowing.

Meanwhile, to embody the membrane-type resistive switch to operate at a low voltage, the spring constant k of the membrane 24 should be small. To make the spring constant k of the membrane 24 small, the physical lengths of the top electrode 26 and the membrane 24 should be long. Therefore, although the operating voltage could be low, it takes longer time for the switch to go back to the off state by the restoring force. Due to this correlation between the physical length and the operating voltage, technically, it is very hard to form a high-speed switch that operates at a low voltage.

As described above, resistive and capacitive MEMS switches should necessarily be operated at a high-speed at a low voltage in order to be applied to a mobile communication area. To be operated at a high-speed at a low voltage, they should be able to satisfy the following conditions.

A resistive switch, both membrane type and cantilever type alike, should have short physical length and small spring constant of the actuator. In case of a capacitive switch, the capacity ratio of the on and off states should be raised, and the air gap and the operating voltage should be lowered necessarily.

SUMMARY OF THE INVENTION

It is, therefore, an object of the present invention to provide a radio frequency (RF) device using a micro-electronic-mechanical system (MEMS) technology that can be applied to a mobile communication area by reducing the operating voltage while heightening the operating rate of the RF device.

In accordance with an aspect of the present invention, there is provided a radio frequency device using a micro-electronic-mechanical system (MEMS) technology, comprising: a substrate; a first electrode which is mounted on the substrate and forms an actuator, part of the first electrode not contacting the substrate; and a second electrode which is apart in a regular space from the substrate and forms an actuator, part of the second electrode being overlapped with the first electrode, wherein the first electrode and the second electrode contact each other at a contact point by an electrostatic attractive force generated between the two electrodes.

In accordance with another aspect of the present invention, there is provided a radio frequency device using a MEMS technology, comprising: a substrate; a first electrode which is mounted on the substrate, and forms an actuator, part of the first electrode not contacting the substrate; a second electrode which is apart in a regular space from the substrate and forms an actuator, part of the second electrode being overlapped with the first electrode; and a third electrode which is apart in a regular space from the circumferential surface of the substrate and forms an actuator, part of the second electrode being overlapped with the second electrode, wherein the first electrode and the second electrode contact each other at a contact point by an electrostatic attractive force generated between the first electrode and the second electrode, and an electrostatic repulsive force generated between the second electrode and the third electrode.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Embodiment 1

Figure 1:
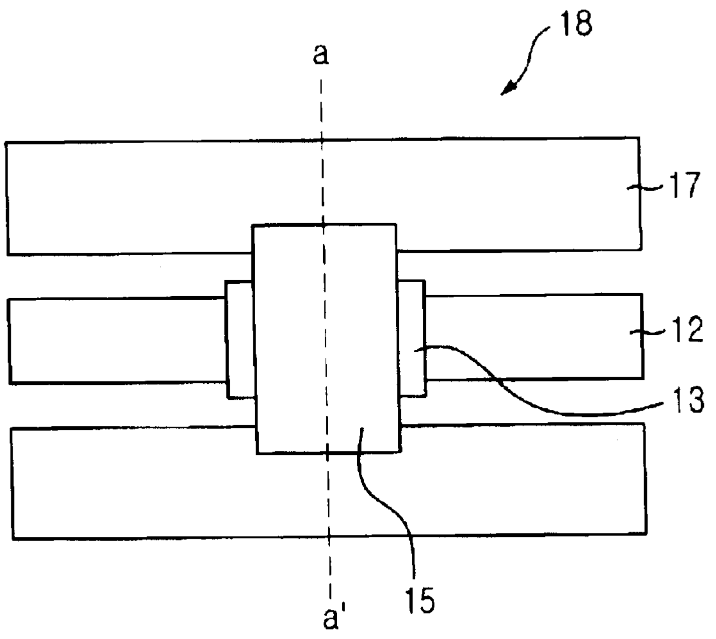
FIG. 1 (PRIOR ART)
FIG. 1 is a plane figure showing a conventional membrane-type capacitive switch.
Figure 2:
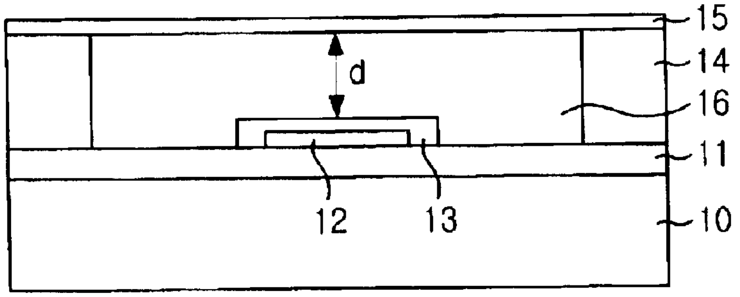
FIG. 2 (PRIOR ART)
FIG. 2 is a cross-sectional view illustrating the capacitive switch of FIG. 1, cut along the line a–a'.
Figure 3:
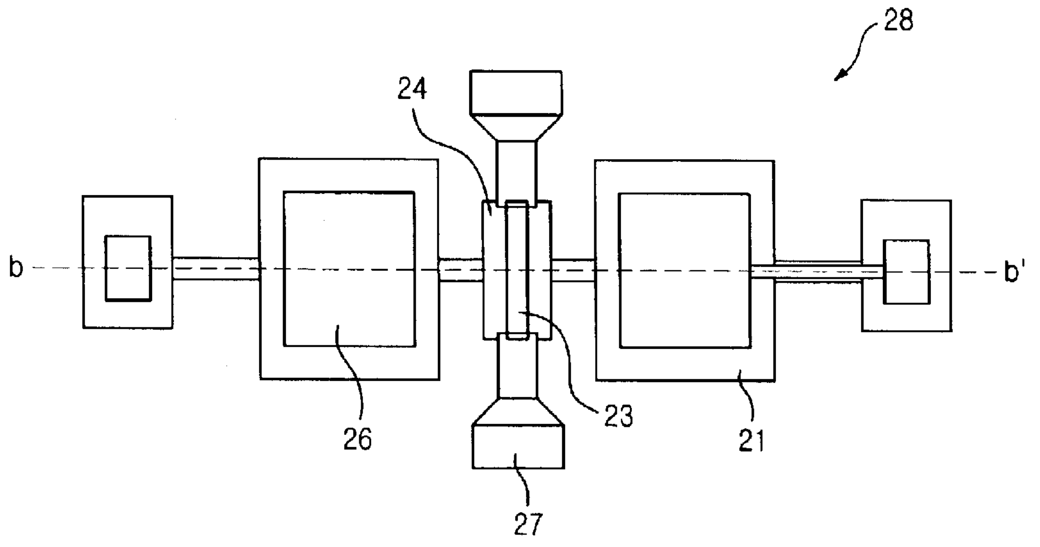
FIG. 3 (PRIOR ART)
FIG. 3 is a plane figure showing a conventional membrane-type resistive switch.
Figure 4:
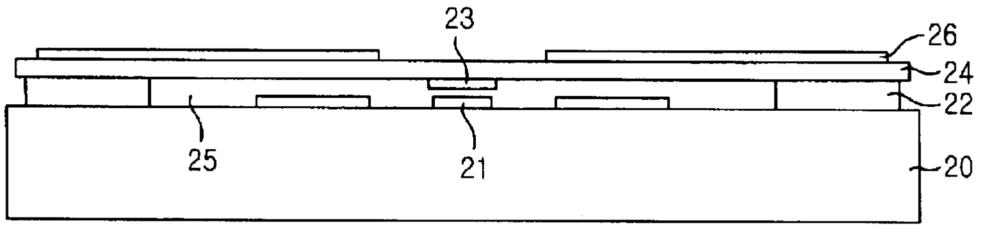
FIG. 4 (PRIOR ART)
FIG. 4 is a cross-sectional view illustrating the resistive switch of FIG. 3, cut along the line b–b'.
Figure 5:
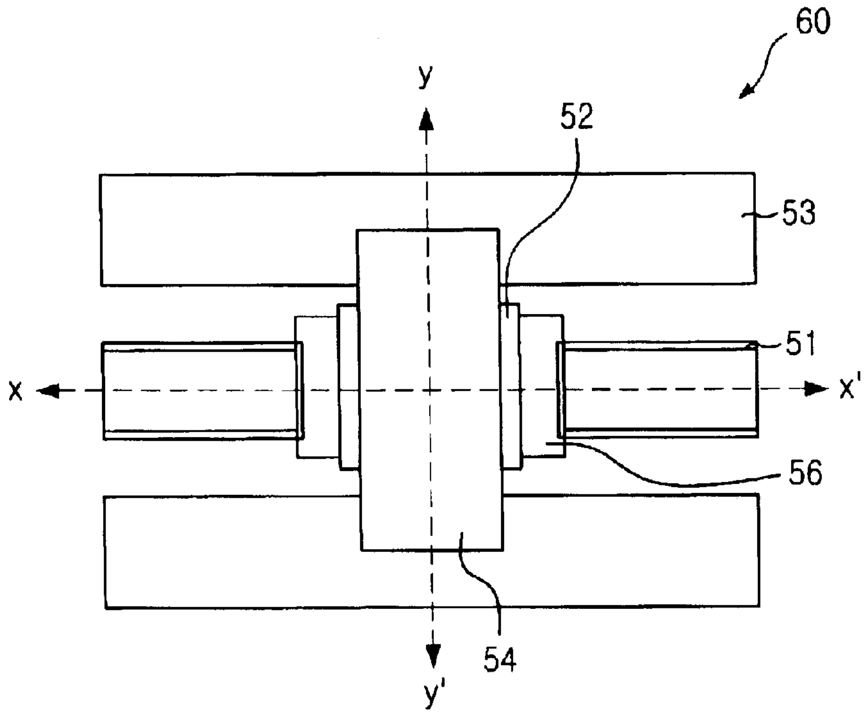
FIG. 5 is a plane figure describing a capacitive micro-electronic-mechanical system (MEMS) switch in accordance with a first embodiment of the present invention.
Figure 6:
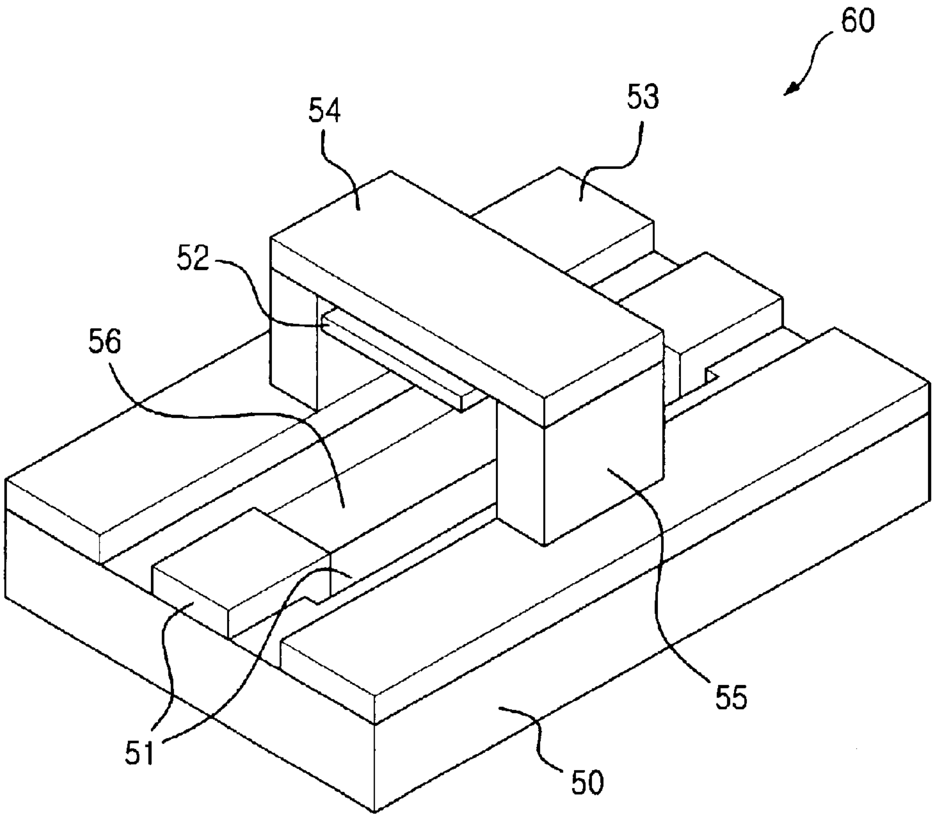
FIG. 6 is a perspective diagram illustrating the MEMS switch of FIG. 5.

FIG. 5 is a plane figure describing a capacitive micro-electronic-mechanical system (MEMS) switch in accordance with a first embodiment of the present invention, and FIG. 6 is a perspective diagram illustrating the MEMS switch of FIG. 5.

Referring to FIGS. 5 and 6, a capacitive switch 60, which is fabricated through such general processing as photolithography, etching, deposition and lifting-off, is formed on a substrate 50 having a characteristic of insulation, semi-insulation or polymerization.

The capacitive switch 60 has two parts: One is an actuator, that is a moving part, and the other is a part fixed on the substrate 50. The present embodiment of this invention is different from the conventional technology in that a first electrode 51, to which an external signal is supplied, works as an actuator along with a second electrode 54. To make the first electrode 51 move as an actuator, the first electrode 51 is formed to have a membrane or cantilever structure by forming the first electrode 51 in a shape of stack so as to receive a signal from the outside, and then etching the substrate 50 under the first electrode 51.

To be more specific, the first electrode 51 that receives an RF signal from the outside is formed in a shape of stack and has a regular space with the substrate 50, which is positioned under the first electrode 51 and has an etched shape, so that the first electrode 51 can be bent by an electrostatic attractive force. With the first electrode 51 in between, two grounding surfaces 53, which are formed of metal wires are positioned on the substrate 50. Here, the first electrode 51 and the grounding surfaces 53 are arranged in the direction of the line x–x'.

The neighboring two grounding surfaces 53 are supported by a supporting material 55 at the ends, and a second electrode 54 that receives DC voltage is arranged in the direction of the line y–y' to be crossed over with the first electrode 51 on a plane. A dielectric layer 52 is formed on one surface of the second electrode 54 that is facing and overlapped with the first electrode 51.

When a DC voltage is supplied to the second electrode 54, the first electrode 51 and the second electrode 54 are bent at the same time due to the electrostatic attractive force generated by the electric potential difference between the first electrode 51 and the second electrode 54. The two electrodes meet each other at a contact point around at the center, and thus the dielectric layer 52 at the lower part of the second electrode 54 contacts the first electrode 51 directly.

Since the first electrode 51 and the second electrode 54 are formed of such metals as Al and Cu, respectively, when they are bent and contact each other, a metal electrode capacitor of the first electrode 51/dielectric layer 52/second electrode 54 is formed. Therefore, the RF signal supplied to the first electrode 51 is shut by the capacitor, and the grounding surface 53 grounds the RF signal and the DC voltage.

Here, the distance the first electrode 51 and the second electrode 54 make move is controlled by the difference between the spring constant k of the first electrode 51 and that of the second electrode 54.

Figure 7:
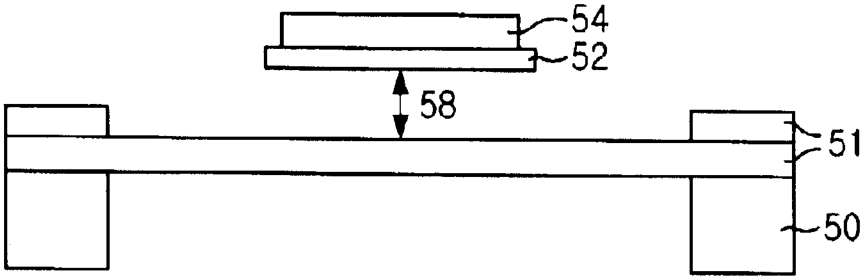
FIG. 7 is a cross-sectional view showing the capacitive MEMS switch of FIG. 5, cut along the line x–x'.
Figure 8:
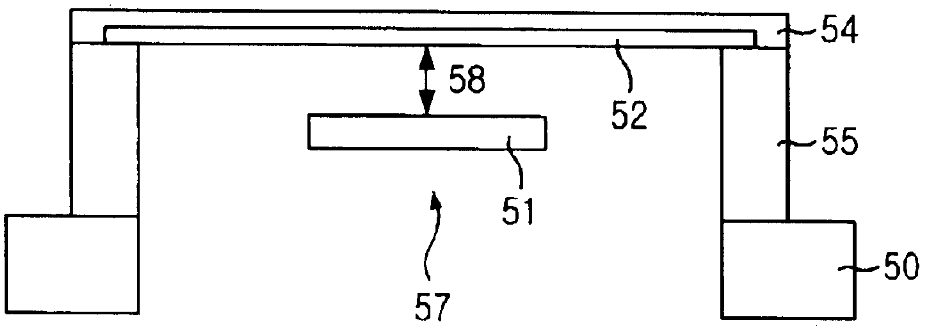
FIG. 8 is a cross-sectional view describing the capacitive MEMS switch of FIG. 5, cut along the line y–y'.

FIG. 7 is a cross-sectional view showing the capacitive MEMS switch of FIG. 5, cut along the line x–x', and FIG. 8 is a cross-sectional view describing the capacitive MEMS switch of FIG. 5, cut along the line y–y'.

Referring to FIGS. 7 and 8, the first electrode 51 of the stack structure is an integrated form. Both sides of the first electrode 51 are supported by the substrate 50. Also, the first electrode 51 has a structure of membrane having a cavity 57 in the lower part. The second electrode 54, too, is fixed on the substrate 50 by a supporting material 55, and has a structure of membrane having a regular space of an air gap 58 with the first electrode 51.

Accordingly, in the present embodiment, since the first electrode 51 and the second electrode 54 are moved simultaneously, the distance the second electrode 54 moves can be shortened by a half, compared to the conventional technology where the first electrode 51 is fixed on the substrate 50 and only the second electrode 54 can be moved.

In addition, when the first electrode 51 and the second electrode 54 are moved simultaneously, the contacting time, i.e., switching time, is reduced in comparison with the prior art.

The conventional capacitive MEMS switch has a high operating voltage. However, in the switch structure of the present invention, the switching is performed in a low operating voltage, because the distance between the first electrode 51 and the second electrode 54 is shortened. Therefore, in this embodiment of the present invention, the switching can be performed at a high speed at a low operating voltage.

Embodiment 2

Figure 9:
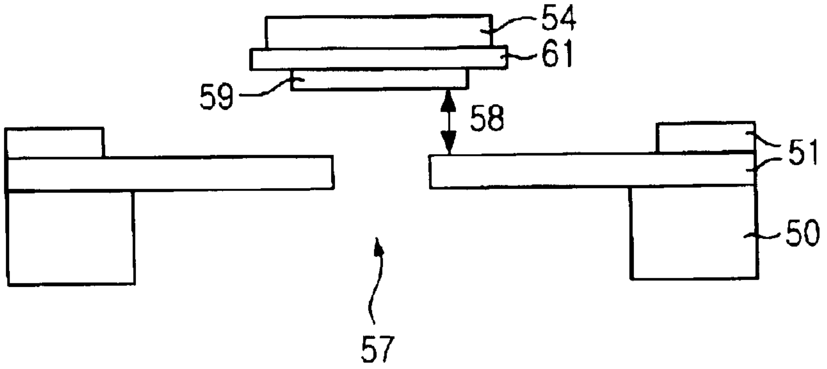
FIG. 9 is a cross-sectional view illustrating a resistive MEMS switch, cut along a line corresponding to the line x–x' of FIG. 5, in accordance with a second embodiment of the present invention.
Figure 10:
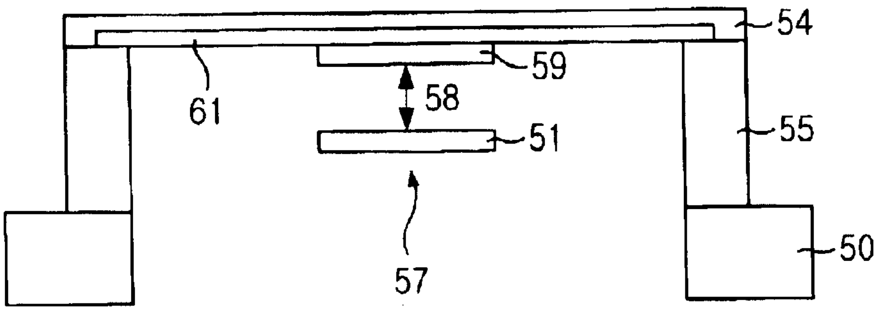
FIG. 10 is a cross-sectional view describing the resistive MEMS switch, cut along a line corresponding to the line y–y' of FIG. 5, in accordance with the second embodiment of the present invention.

FIG. 9 is a cross-sectional view illustrating a resistive MEMS switch, cut along a line corresponding to the line x–x' of FIG. 5, in accordance with a second embodiment of the present invention; and FIG. 10 is a cross-sectional view describing the resistive MEMS switch, cut along a line corresponding to the line y–y' of FIG. 5, in accordance with the second embodiment of the present invention. The same reference numerals are given for the same constitutional elements of the capacitive MEMS switch of FIG. 5.

Referring to FIGS. 9 and 10, the first electrode 51 having a stack structure can be separable, and one side of the first electrode 51 is supported by the substrate 50. The first electrode 51 is a cantilever type that has the cavity 57 in the lower part.

The second electrode 54 is fixed on the substrate 50 by the supporting material 55 and has an air gap 58 of a regular space with the first electrode 51. That is, the second electrode 54 has a membrane structure.

To simplify the drawing, the same reference numerals are given for the same constitutional elements shown in FIGS. 7 and 8, and detailed description on the elements are omitted.

The switches of FIGS. 9 and 10 are of the resistive types. So, a conductive contact pad 59 is positioned on a surface of the second electrode 54 that confront the first electrode 51, and an insulation layer 61 is inserted between the contact pad 59 and the second electrode 54.

The insulation layer 61 is also referred to as a cantilever insulation layer. It is the part where the two electrodes 51 and 54 contact each other in the capacitive MEMS switch. It works the role of blocking the flow of the DC voltage from the second electrode 54 to the first electrode 51.

When a DC voltage is supplied to the second electrode 54, an electrostatic attractive force is generated between the first electrode 51 and the second electrode 54. Then, the two electrodes 51 and 54 become bent and perform the switching operation that makes the contact pad 59 contacts the first electrode 51.

Just as the cases of FIGS. 7 and 8, in this embodiment, too, part of the first electrode 51 moves together with the second electrode 54. Therefore, compared with the conventional technology where the signal line, i.e., the first electrode 51 is fixed, the switching path becomes short, thus making the switching time quick.

Accordingly, the technology of the present invention can improve the low switching rate of the conventional resistive MEMS switch. The conventional resistive MEMS switch has a problem of a low operating speed as low as several $\mu$m, so it could not be applied to the mobile communication systems, although it can be operated at a low operating voltage.

Embodiment 3

Figure 11:
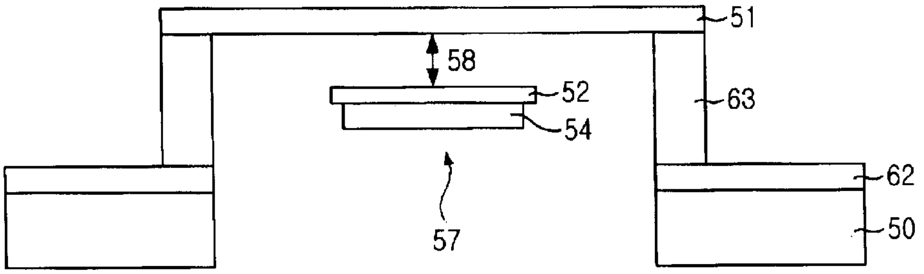
FIG. 11 is a cross-sectional view showing a capacitive MEMS switch in accordance with a third embodiment of the present invention.

FIG. 11 is a cross-sectional view showing a capacitive MEMS switch in accordance with a third embodiment of the present invention. The same reference numerals are given to the same structural elements of FIG. 7.

Referring to FIG. 11, differently from FIG. 7, the positions of the first electrode 51 and the second electrode 54 are changed each other. The second electrode 54 having a cavity 57 in the lower part between itself and the substrate 50 having a membrane structure is formed. On the upper part of the second electrode 54, an integrated-type first electrode 51 having a membrane structure is formed, both ends of which are supported by the supporting material 63 and the fixed material of the substrate 50. Between the first electrode 51 and the second electrode 54 is an air gap having a regular space.

When a DC voltage is supplied to the second electrode 54 of the capacitive MEMS switch, an electrostatic attractive force is generated by the electric potential difference between the first electrode 51 and the second electrode 54. The electrostatic attractive force bends the two electrodes 51 and 54 and makes them contact each other at a contact point in the center. Accordingly, the dielectric layer 52 formed in one surface of the second electrode 54 that corresponds to the first electrode 51.

Accordingly, since the first electrode 51 and the second electrode 54 are formed of such metals as Al and Cu, respectively, a metal electrode capacitor of the first. electrode 51/dielectric layer 52/second electrode 54 is formed. Therefore, an RF signal supplied from the first electrode 51 is shut by the capacitor and the grounding surface 53 grounds the RF signal and the DC voltage.

Embodiment 4

Figure 12:
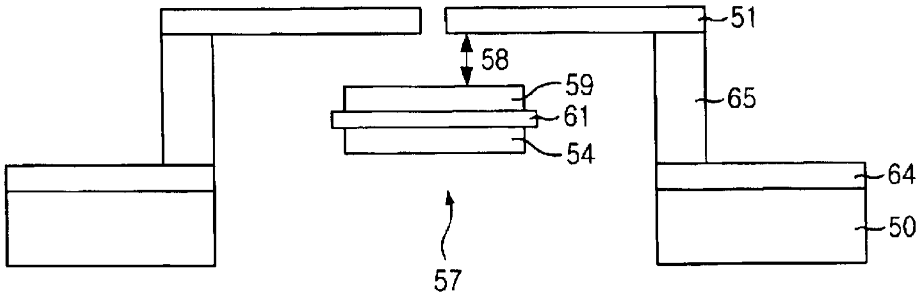
FIG. 12 is a cross-sectional view showing a capacitive MEMS switch in accordance with a fourth embodiment of the present invention.

FIG. 12 is a cross-sectional view showing a capacitive MEMS switch in accordance with a fourth embodiment of the present invention. In the drawing, the locations of the first electrode and the second electrode of FIG. 9 are changed with each other. The same referential numerals are given to the same structural element of FIG. 9.

Referring to FIG. 12, since the locations of the first electrode and the second electrode of FIG. 9 are changed with each other, the second electrode 54 having a membrane structure is provided with a cavity 57 in the lower part and between itself and the substrate 50. On top of the second electrode 54, a separable-type first electrode 51 having a cantilever structure is formed. Both sides of the first electrode 51 are supported by the supporting material 65 and the fixed material 64 of the substrate 50, and an air gap 58 of a regular space is formed between the first electrode 51 and the second electrode 54.

Both ends of the second electrode 54 are fixed on and supported by the substrate 50. Since the switch of FIG. 12 is a resistive switch, a conductive contact pad 59 is formed on a surface of the second electrode 54 that confronts the first electrode 51. Between the contact pad 59 and the second electrode 54 is an insulation layer 61.

The insulation layer 61 is also referred to as a cantilever insulation layer. It is a part where the two electrodes 51 and 54 contact each other in the resistive MEMS switch. It blocks the flow of the DC voltage supplied from the second electrode 54 to the radio frequency line, i.e., the first electrode 51.

When a DC voltage is supplied to the second electrode 54, an electrostatic attractive force is generated between the first electrode 51 and the second electrode 54. The electrostatic attractive force incurs switching operation by bending the two electrodes 51 and 54 and thus making the contact pad 59 contact the first electrode 51.

Differently from the conventional technology where the signal line, i.e., first electrode 51 is fixed, in the present invention, the second electrode 54 and part of the first electrode 51 are operated together. Therefore, the switching path is shortened and the switching time becomes quick.

Embodiment 5

Figure 13:
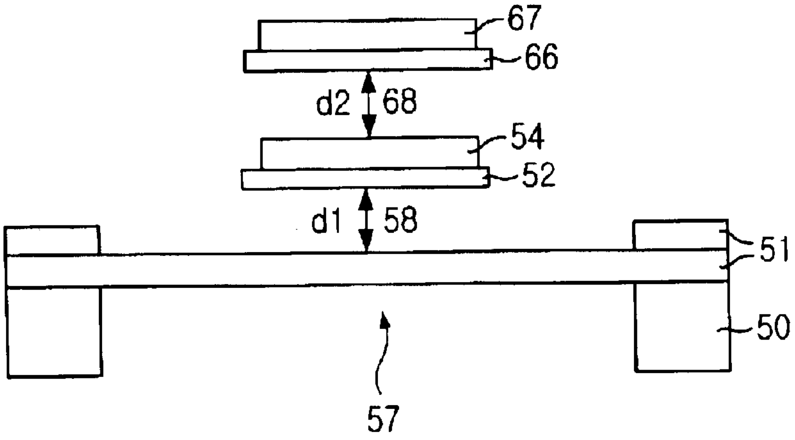
FIG. 13 is a cross-sectional view showing a resistive MEMS switch in accordance with a fifth embodiment of the present invention.

FIG. 13 is a cross-sectional view showing a resistive MEMS switch in accordance with a fifth embodiment of the present invention. The switch of FIG. 13 is a modified form of the capacitive MEMS FIG. 7. Here, the same reference numerals are given to the same structural elements of FIG. 7.

Referring to FIG. 13, the first electrode 51 is an integrated type and has a stack structure, just as the switch of FIG. 7. Both ends of the first electrode 51 are supported by the substrate 50, and the first electrode 51 has a membrane structure having a cavity 57 in the lower part. The second electrode 54 is also fixed on the substrate 50 and supported by a supporting material (not shown). The second electrode 54 has a membrane structure having an air gap 58 with the first electrode 51, the space of the air gap 58 being d1. A first dielectric layer 52 is formed on a surface of the second electrode 54 that confronts the first electrode. The first dielectric layer 52 is crossed over and overlapped with the first electrode 51 on a plane.

The switch of FIG. 13 further includes a third electrode 67 on top of the same structure of FIG. 7. The third electrode 67 further includes a second dielectric layer 66 on one of its surfaces that confronts the second electrode 54. The third electrode 67 has a membrane structure having an air gap 68 between itself and the second electrode 54, the space of the air gap 68 being d2.

All of the first, second and third electrodes 51, 54, and 67 are of a membrane structure, and a DC voltage can be supplied to both of the second and third electrodes 54 and 67.

Accordingly, when a DC voltage (i.e., operating voltage) is supplied to the second and third electrodes 54 and 67 simultaneously, the same potential is formed in the second and third electrodes 54 and 67, thus generating an electrostatic repulsive force between them. Therefore, the second electrode 54 is repelled back towards the first electrode 51, and between the first and second electrodes 51 and 54, an electrostatic attractive force generated by their different potentials is operated.

Accordingly, the first and second electrodes 51 and 54 are bent simultaneously and contact each other. Thus, an RF signal is shut by the capacitor having a metal electrode structure of the first electrode 51/first dielectric layer 58/second electrode 54.

Embodiment 6

Figure 14:
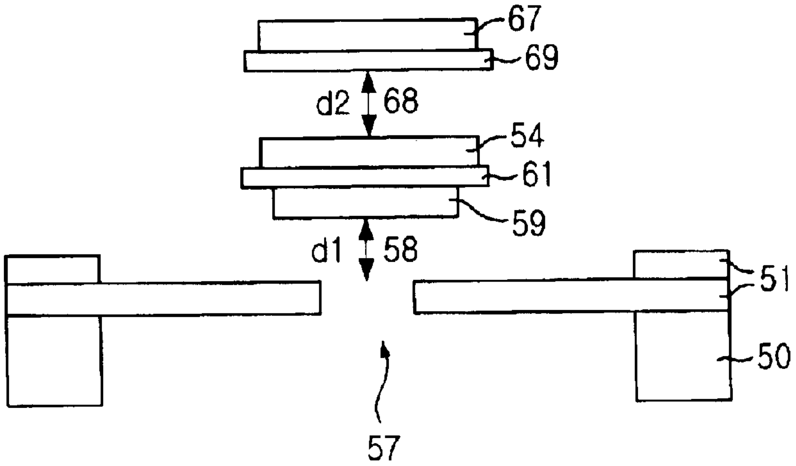
FIG. 14 is a cross-sectional view showing an MEMS switch in accordance with a sixth embodiment of the present invention.

FIG. 14 is a cross-sectional view showing an MEMS switch in accordance with a sixth embodiment of the present invention. The switch of FIG. 14 is a modified form of the capacitive switch of FIG. 9. Here, the same reference numerals are given to the same structural elements.

Referring to FIG. 14, a first electrode 51 is a separable type, just as that of FIG. 9. One side of the first electrode 51 is supported by a substrate 50, and the first electrode 51 is of a cantilever structure having a cavity 57 in the lower part of it. The second electrode. 54 is fixed on a substrate 50 supported by a supporting material (not shown), and it is of a membrane structure having an air gap 58 with the first electrode, the space of the air gap 58 is d2.

A contact pad 58 is formed on the second electrode 54, which is overlapped with and confronts the first electrode 51 on a plane. Between the contact pad 58 and the second electrode 54 is an insulation layer 61.

The switch of FIG. 14 further includes a third electrode 67 over the same switch of FIG. 9. On a surface of the third electrode 67, a dielectric layer 69 is formed confronting the second electrode 54. The third electrode 6 7 has a membrane structure having an air gap 68 between itself and the second electrode 54. The space of the air gap 68 is d2.

Here, the first electrode 51 is of a cantilever type, and the second and third electrodes 54 and 67 have a membrane structure. A DC voltage is supplied to both of the second and third electrodes 54 and 67.

Accordingly, when a DC voltage (i.e., operating voltage) is supplied to the second and third electrodes 54 and 67 simultaneously, the same potential is formed in the second and third electrodes 54 and 67, thus generating an electrostatic repulsive force between them. Therefore, the second electrode 54 is repelled back towards the first electrode 51. Here, an electrostatic attractive force is operated between the first and second electrodes 51 and 54 due to their different potentials. Accordingly, the first and second electrodes 51 and 54 are bent simultaneously and contact each other.

The switch of the sixth embodiment of the present invention can perform a switching operation that makes the first and second electrodes 51 and 54 contact each other and transmits the RF signal by using the attractive force between the first and second electrodes and the repulsive force between the second and third electrodes simultaneously. Therefore, the operation speed (i.e., switching rate) becomes quicker than that of FIG. 9. Generally, when the switch is off, the switch is restored by the repulsive force between the first and second electrodes 51 and 54. However, if the voltage is supplied only to the third electrode 67, the second electrode is pulled towards the third electrode 67 by the attractive force, the switch can be turned off even more rapidly. When the switch is turned off, the operation speed can be quickened, too.

As described above, the present invention provides an MEMS switch that embodies the high operating voltage of the conventional capacitive MEMS switch to a low operating voltage, and the low switching time of the resistive MEMS switch to a high switching time. The above embodiments show that if the signal line, which is part of the first electrode, is embodied as an actuator having a cantilever structure and operated together with the second electrode, the problems of the conventional resistive or capacitive MEMS switches can be solved.

In other words, in one embodiment of the present invention, to reduce the switching time and operating voltage more effectively, the bottom surface of part of the conventional bottom electrode (signal line) fixed on the substrate is etched to form part of the signal line into a membrane structure. Then, part of the bottom electrode is drawn up by the electrostatic force by the top electrode and reduces the air gap space. That is, the pull-in voltage is reduced by shortening the contact switching time between the top electrode and the bottom electrode.

Conventionally, when a capacitive or resistive MEMS switch is embodied by forming a membrane having a physical length as small as 200×100 $\mu m^2$, a switching time of less than 10 s at an operation voltage of over 20 $\mu$s can be embodied. However, when this is applied to the mobile communication system, a switching time as fast as 1 $\mu$s at an operating voltage at least less than 3V is required.

Therefore, in the present invention, the substrate in the lower part of part of lower electrode (i.e., signal line) is etched in a rear substrate etching process for a high-speed switching operation under a lower voltage. Then, the top and bottom electrodes are bent simultaneously by the electrostatic force by the top electrode so that the air gap is reduced. That is, the contact switching time between the top electrode and the bottom electrode is reduced and thus, the pull-in voltage is dropped.

As described above, the MEMS device of the present invention can be operated at a high speed at a low voltage by embodying the signal line as an actuator. Therefore, its application range can be expanded into various fields, including a mobile communication area.

While the present invention has been described with respect to certain preferred embodiments, it will be apparent to those skilled in the art that various changes and modifications may be made without departing from the scope of the invention as defined in the following claims. In other words, besides the switch which make use of the contact between the first electrode and the second electrode, the technology of the present invention can be applied to diverse MEMS devices.

What is claimed is:

1. A radio frequency device using a micro-electronic-mechanical system (MEMS) technology, comprising:

a substrate;

a first electrode which is mounted on the substrate and forms an actuator, part of the first electrode not contacting the substrate; and a second electrode which is apart in a regular space from the substrate and forms an actuator, part of the second electrode being overlapped with the first electrode, wherein the first electrode and the second electrode contact each other at a contact point by an electrostatic attractive force generated between the two electrodes.

2. The radio frequency device as recited in claim 1, wherein part of the substrate in the lower part of the first electrode is etched so that the first electrode could have a regular space between the first electrode and the substrate.

3. The radio frequency device as recited in claim 1, wherein a direct current voltage is supplied to the first electrode and an external signal is supplied to the second electrode.

4. The radio frequency device as recited in claim 1, wherein an external signal is supplied to the first electrode and a direct current voltage is supplied to the second electrode.

5. The radio frequency device as recited in claim 3, wherein the second electrode is supported on the substrate by a supporting material at both sides on the substrate so that the second electrode could be crossed over and overlapped with the first electrode and have a regular space between the second electrode and the first electrode.

6. The radio frequency device as recited in claim 4, wherein the first electrode has a membrane structure, which is an integrated type where a cavity is formed between the first electrode and the substrate, or a cantilever structure, which is a separation type where one side of the first electrode is combined with and supported by the substrate.

7. A radio frequency device using a MEMS technology, comprising:

a substrate;

a first electrode which is mounted on the substrate, and forms an actuator, part of the first electrode not contacting the substrate;

a second electrode which is apart in a regular space from the substrate and forms an actuator, part of the second electrode being overlapped with the first electrode; and a third electrode which is apart in a regular space from the circumferential surface of the substrate and forms an actuator, part of the second electrode being overlapped with the second electrode, wherein the first electrode and the second electrode contact each other at a contact point by an electrostatic attractive force generated between the first electrode and the second electrode, and an electrostatic repulsive force generated between the second electrode and the third electrode.

8. The radio frequency device as recited in claim 7, wherein part of the substrate in the lower part of the first electrode is etched so that the first electrode could have a regular space between the first electrode and the substrate.

9. The radio frequency device as recited in claim 7, wherein an external signal is supplied to the first electrode and a direct current voltage is supplied to the second and third electrodes.

10. The radio frequency device as recited in claim 9, wherein the first electrode has a membrane structure, which is an integrated type where a cavity is formed between the first electrode and the substrate, or a cantilever structure, which is a separation type where one side of the first electrode is combined with and supported by the substrate.

11. The radio frequency device as recited in claim 10, further comprising:

a dielectric layer positioned on a surface of the second electrode that confronts the first-electrode, wherein a capacitor having a structure of the first electrode/dielectric layer/second electrode is formed, when the first electrode contacts the dielectric layer.

12. The radio frequency device as recited in claim 10, further comprising:

a conductive contact pad mounted on a surface of the second electrode that confronts the first electrode, for contacting the first electrode, when an electrostatic attractive force is generated between the first electrode and the second electrode.

* * * * *